US012655518B2

(12) United States Patent
Cheng et al.

(10) Patent No.: US 12,655,518 B2
(45) Date of Patent: Jun. 16, 2026

(54) WAFER SUSCEPTOR

(71) Applicant: ENKRIS SEMICONDUCTOR, INC.,
Suzhou (CN)

(72) Inventors: Kai Cheng, Suzhou (CN); Liyang Zhang, Suzhou (CN)

(73) Assignee: ENKRIS SEMICONDUCTOR, INC.,
Suzhou (CN)

(*) Notice: Subject to any disclaimer, the term of this patent is extended or adjusted under 35 U.S.C. 154(b) by 647 days.

(21) Appl. No.: 18/074,419

(22) Filed: Dec. 2, 2022

(65) Prior Publication Data

US 2023/0098865 A1     Mar. 30, 2023

Related U.S. Application Data

(63) Continuation of application No. PCT/CN2020/113763, filed on Sep. 7, 2020.

(51) Int. Cl.
*H01J 37/32*     (2006.01)
*C23C 16/30*     (2006.01)
*C23C 16/458*     (2006.01)

(52) U.S. Cl.
CPC ........ *C23C 16/303* (2013.01); *C23C 16/4581* (2013.01); *H01J 37/32715* (2013.01)

(58) Field of Classification Search
CPC ... C23C 14/50; C23C 16/458; C23C 16/4581; C23C 16/4582; C23C 16/4583; H01J 37/32715; C30B 25/12
USPC ................. 118/728; 204/298.15; 156/345.51
See application file for complete search history.

(56) References Cited

U.S. PATENT DOCUMENTS

| | | | |
|---|---|---|---|
| 2009/0272323 A1* | 11/2009 | Ito | C23C 16/46 438/758 |
| 2017/0121819 A1 | 5/2017 | Swaminathan et al. | |
| 2019/0169745 A1 | 6/2019 | Krishnan et al. | |

FOREIGN PATENT DOCUMENTS

| | | |
|---|---|---|
| CN | 102031498 A | 4/2011 |
| CN | 102576669 A | 7/2012 |
| CN | 103305814 A | 9/2013 |
| CN | 103374713 A | 10/2013 |
| CN | 106531676 A | 3/2017 |
| CN | 108085659 A | 5/2018 |

OTHER PUBLICATIONS

International Search Report issued in corresponding PCT Application No. PCT/CN2020/113763, dated May 26, 2021.

* cited by examiner

*Primary Examiner* — Rodney G Mcdonald
(74) *Attorney, Agent, or Firm* — Westbridge IP LLC

(57)     ABSTRACT

Disclosed is a wafer susceptor. A groove bottom of the wafer susceptor is divided by a first dividing line passing through a center of a groove into a first region close to a center of the wafer susceptor and a second region away from the center of the wafer susceptor. The groove bottom includes a groove bottom surface and a convex structure formed on the groove bottom surface. An average height of the convex structure located in the second region is greater than that of the convex structure located in the first region. A design structure of the groove bottom of the wafer susceptor well matches a warped III-V group nitride wafer in an active region epitaxial process.

10 Claims, 5 Drawing Sheets

WAFER SUSCEPTOR

CROSS-REFERENCE TO RELATED APPLICATIONS

The present application is a continuation of International Application No. PCT/CN2020/113763, filed on Sep. 7, 2020, all contents of which are incorporated herein by reference in its entirety.

TECHNICAL FIELD

The present application relates to a semiconductor manufacturing device, in particular to a wafer susceptor used for Metal-Organic Chemical Vapor Deposition (MOCVD).

BACKGROUND

Graphite discs are essential accessories for MOCVD devices. Currently, commonly used graphite discs are generally circular, some grooves are distributed on the graphite discs and used for accommodating substrates, and these substrates are used for growing epitaxial layers. A graphite disc is made of high-purity graphite and coated with SiC coating on its surface. In an epitaxial growth process, a graphite disc with a substrate is heated by radiation using a heating wire in a MOCVD reaction chamber.

FIG. 1 is a schematic diagram of a current wafer susceptor. The wafer susceptor 10 includes three grooves 20, and a wafer 30 is placed in one of the grooves 20. FIG. 2 is a schematic structural diagram of the A-A' section shown in FIG. 1, and a bottom of a groove is usually flat, convex, or concave. For a GaN-on-Silicon process, a stress engineering technology is required to grow a buffer layer. When an active region is grown, an epitaxial wafer is convexly warped. Therefore, a convex groove is generally used for a GaN-on-Silicon light-emitting structure. However, usage of the convex groove has following problems: in a case that the wafer 30 is placed in the groove 20, since the wafer susceptor 10 rotates at a high speed in a growth process of the wafer 30, the wafer 30 in the groove 20 is affected by a centrifugal force, and the wafer 30 moves in a direction away from a center C of the wafer susceptor. A convex structure at a groove bottom makes a gap between a part of the wafer 30 away from the center C of the wafer susceptor 10 and the bottom of the wafer susceptor 10 relatively large, which results in a relatively large difference in the distance between the wafer 30 and the bottom of the groove 20, causing the wafer 30 to be obviously heated unevenly in the growth process, and further affecting quality of the wafer 30. In addition, a wavelength of the III-V group nitride light-emitting wafer 30 is more sensitive to temperature, which is likely to cause a large wavelength difference in the wafer 30, resulting in a great increase in time and cost and a decrease in yield in subsequent chip manufacturing process and sorting work.

Based on the above descriptions, it is necessary to provide a wafer susceptor structure used in a MOCVD device that can effectively improve heating uniformity of a wafer epitaxy.

SUMMARY

A purpose of the present application is to provide a wafer susceptor that can effectively improve heating uniformity of a wafer epitaxy by adjusting a shape of a bottom of a groove, to improve quality and epitaxy of III-V group nitride epitaxial growth and intra-wafer wavelength uniformity of a photoelectric epitaxial wafer.

The present application provides a wafer susceptor, including at least one groove, where the groove includes: a groove bottom, where the groove bottom is divided by a first dividing line passing through a center of the groove into a first region close to a center of the wafer susceptor and a second region away from the center of the wafer susceptor, the groove bottom includes a groove bottom surface and a convex structure formed on the groove bottom surface, a point, closest to the center of the wafer susceptor, on an edge of the convex structure is a first edge point, and a point, farthest away from the center of the wafer susceptor, on the edge of the convex structure is a second edge point. An average height of the convex structure located in the second region is greater than that of the convex structure located in the first region.

As an optional technical solution, the groove further includes a groove side portion, and the edge of the convex structure abuts against the groove side portion.

As an optional technical solution, the first dividing line is a straight line, and the first dividing line is perpendicular to a first center line passing through the center of the wafer susceptor and the center of the groove.

As an optional technical solution, the first dividing line is an arc with the center of the wafer susceptor as a center and a distance between the center of the wafer susceptor and the center of the groove as a radius.

As an optional technical solution, a surface of the convex structure is a curved surface, the curved surface is provided with a vertex, and a projection of the vertex on a horizontal plane is located in the second region of the groove bottom.

As an optional technical solution, the projection of the vertex on the horizontal plane is located on a first center line.

As an optional technical solution, the curved surface of the convex structure is composed of innumerable curves staring from the vertex to the edge of the convex structure, a curvature radius of each of the innumerable curves is a fixed value, and curvature radii of the innumerable curves gradually decrease from the first edge point to the second edge point along the edge of the convex structure.

As an optional technical solution, the curved surface of the convex structure is composed of innumerable curves passing through the vertex and whose both ends are located on the edge of the convex structure, one end of each curve close to the center of the wafer susceptor is a first end, one end of each curve away from the center of the wafer susceptor is a second end, and a curvature radius of each curve gradually decreases from the first end to the second end.

As an optional technical solution, a height of the edge of the convex structure gradually increases from the first edge point to the second edge point along the edge of the convex structure.

As an optional technical solution, on the curved surface of the convex structure, a tangent slope of a curve from the second edge point to the vertex is a positive value, and a tangent slope of a curve from the vertex to the first edge point changes from zero to a negative value.

Compared with the prior art, the present application has the following technical effects.

The groove bottom of the wafer susceptor in the present application is divided by the first dividing line passing through the center of the groove into the first region close to the center of the wafer susceptor and the second region away from the center of the wafer susceptor, the groove bottom includes the groove bottom surface and the convex structure formed on the groove bottom surface, the surface of the convex structure is a curved surface, and the vertex of the curved surface is located in the second region of the groove bottom. Therefore, an average height of the convex structure located in the second region is greater than that of the convex structure located in the first region. A design structure of the groove bottom of the wafer susceptor well resolves a problem of a relatively large gap between a III-V group nitride wafer and the groove bottom due to a centrifugal force and a convex structure, to constantly maintain a reasonable gap between the wafer susceptor and the wafer subjected to a rotational centrifugal force of the wafer susceptor, which reduces an impact of the centrifugal force on growth of the wafer, guarantees stable temperature and air flow, enables a thermal field to be distributed more evenly, thereby improving quality of the epitaxial wafer and wavelength uniformity of the light-emitting epitaxial wafer, and increasing yield. Therefore, the wafer susceptor in this application has an extensive application prospect in fields of semiconductor manufacturing devices designing and manufacturing.

To make the foregoing and other purposes, features, and advantages of this application more obvious and understandable, the following describes optional embodiments below in detail in combination with the accompanying drawings.

DETAILED DESCRIPTION OF THE EMBODIMENTS

The following clearly describes the technical solutions in the embodiments of this application in combination with the accompanying drawings in the embodiments of this application.

Figure 1:
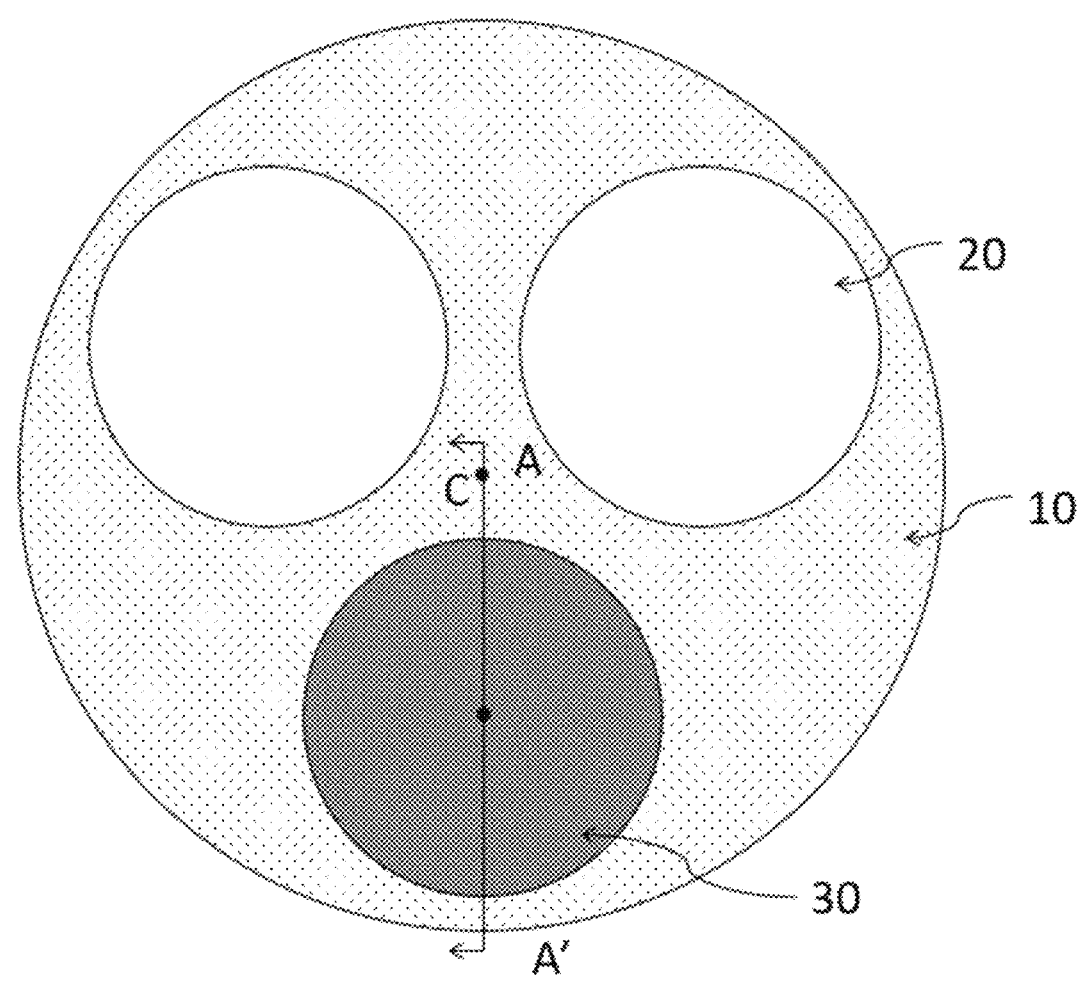
FIG. 1 is a schematic diagram of a current wafer susceptor.
Figure 2:
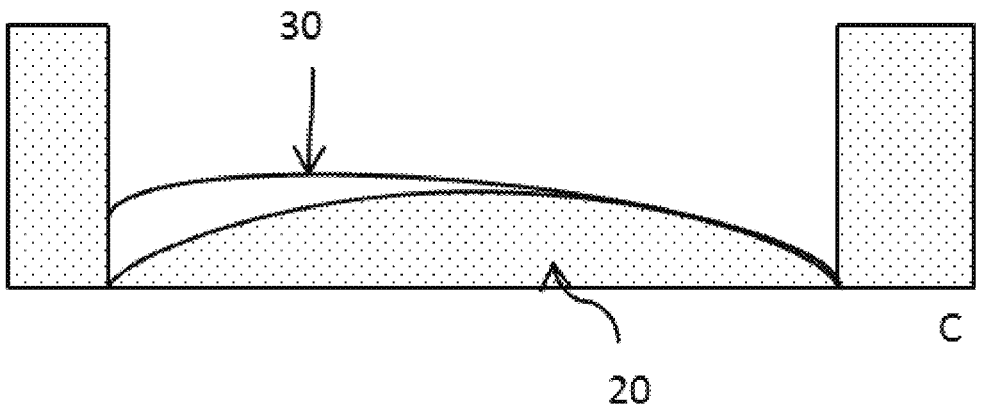
FIG. 2 is a schematic structural diagram of the A-A' section shown in FIG. 1.
Figure 3:
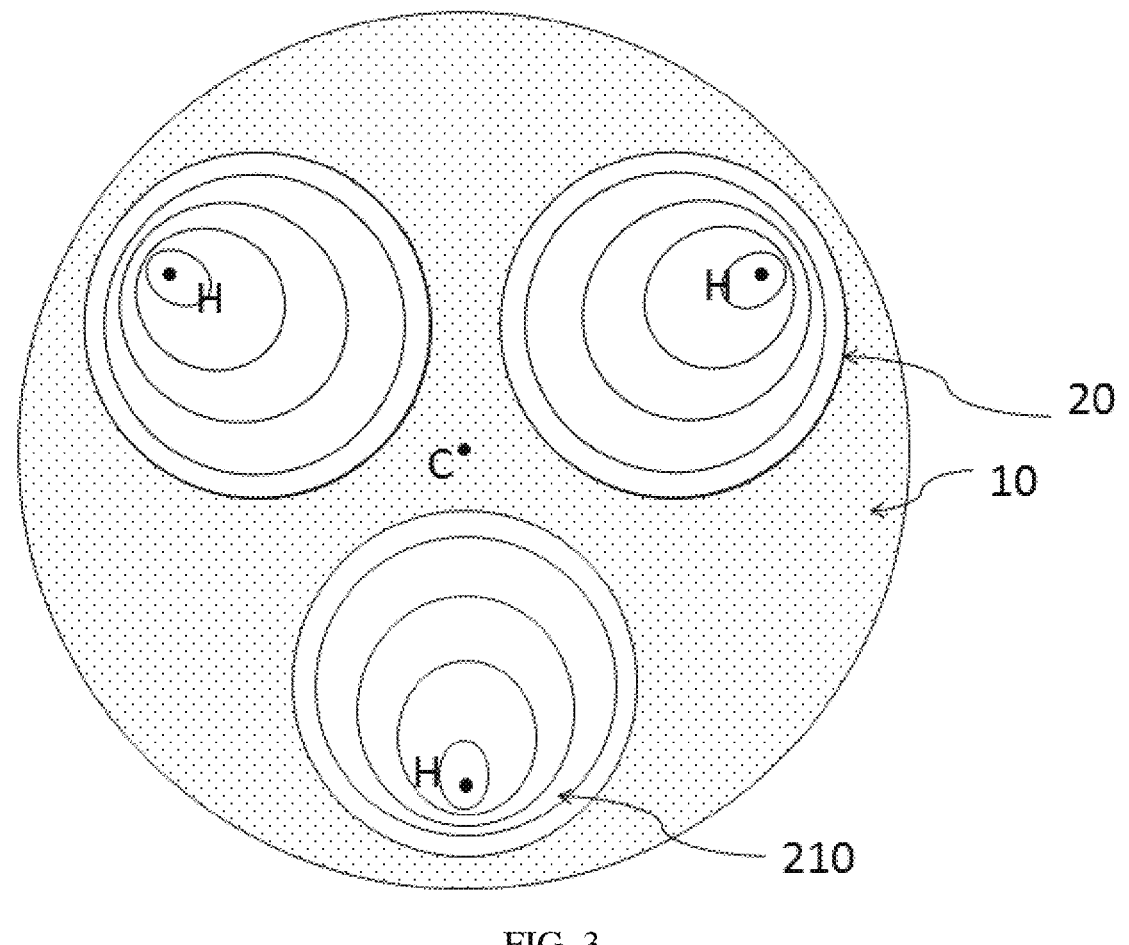
FIG. 3 is a top view of a wafer susceptor according to an embodiment of the present application.

FIG. 3 is a top view of a wafer susceptor 10 according to an embodiment of the present application. As shown in FIG. 3, the wafer susceptor 10 includes at least one groove 20. There are three grooves 20 shown in FIG. 3, and these grooves are arranged in order around a center C of the wafer susceptor 10. However, a quantity, a size, and distribution of grooves 20 of the wafer susceptor 10 are not limited in this application. A person in the art should know that, the quantity, size, and distribution of the grooves 20 can be set flexibly based on a size of a wafer 30. A groove bottom of the groove 20 is divided by a first dividing line L1 into a first region S1 close to the center C of the wafer susceptor and a second region S2 away from the center C of the wafer susceptor. The groove bottom includes a groove bottom surface and a convex structure 210 formed on the groove bottom surface. A point, closest to the center C of the wafer susceptor, on an edge of the convex structure 210 is a first edge point, and a point, farthest away from the center C of the wafer susceptor, on the edge of the convex structure 210 is a second edge point. An average height of the convex structure 210 located in the second region S2 is greater than that of the convex structure 210 located in the first region S1.

Due to a rotational centrifugal force of the wafer susceptor 10, the wafer 30 moves in a direction away from the center C of the wafer susceptor, but the convex structure at the groove bottom makes a gap between a part of the wafer 30 away from the center C of the wafer susceptor 10 and the bottom of the wafer susceptor 10 relatively large, which results in a relatively large difference in the distance between the wafer and the bottom of the groove 20. In the present application, a height of the convex structure 210 at the groove bottom is adjusted, so that a height of a part of the convex structure away from the center C of the wafer susceptor is increased properly, to maintain a reasonable gap between the groove 20 of the wafer susceptor 10 and the wafer 30 subjected to a rotational centrifugal force of the wafer susceptor, which reduces an impact of the centrifugal force on growth of the wafer, guarantees stable temperature and air flow, and enables a thermal field to be distributed more evenly, thereby improving quality of the epitaxial wafer.

Figures 4A, 4B:
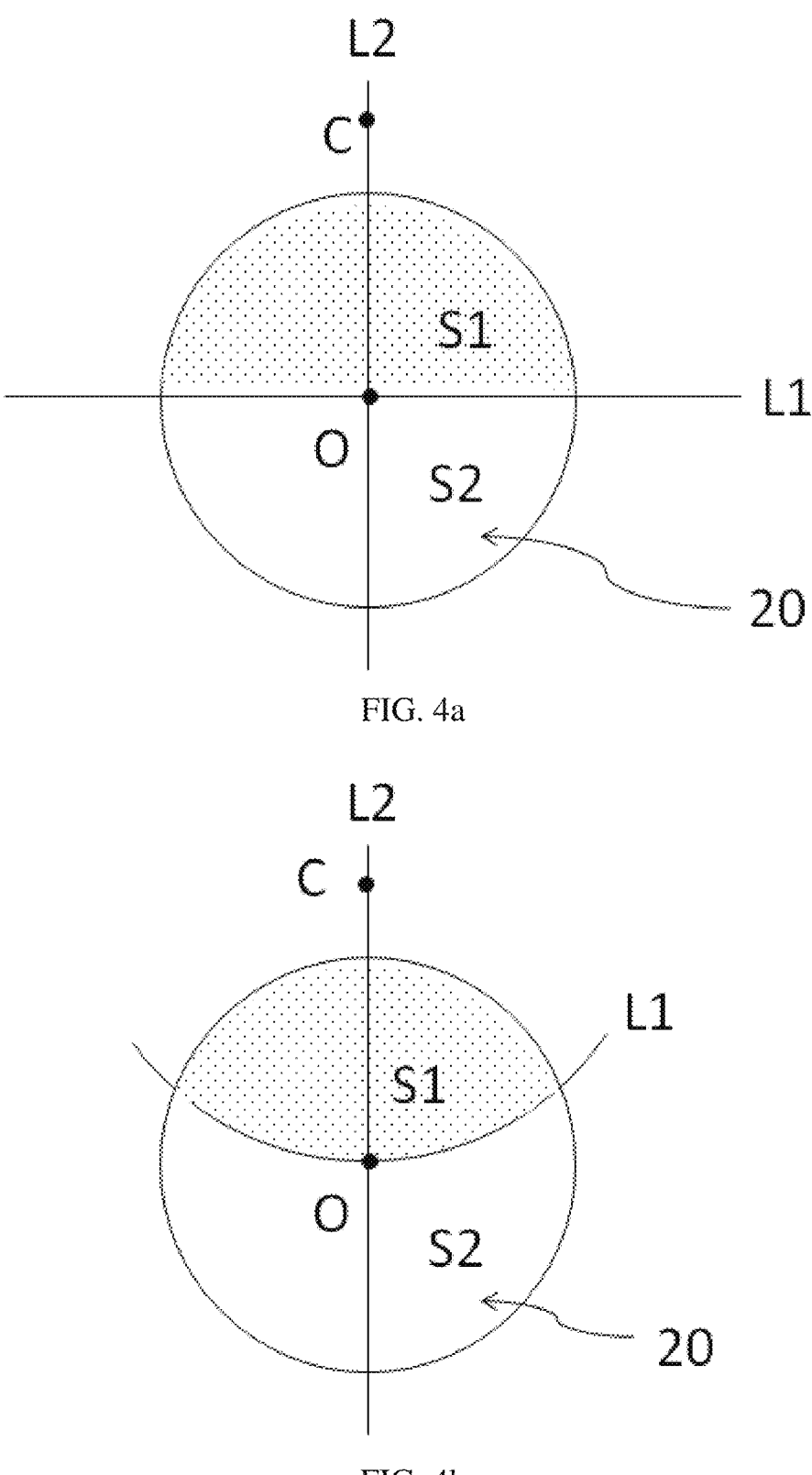
FIG. 4a is a schematic diagram of a location of a first dividing line at a groove bottom according to an embodiment of the present application.
FIG. 4b is a schematic diagram of a location of a first dividing line at a groove bottom according to another embodiment of the present application.

FIG. 4a and FIG. 4b are schematic diagrams of a location of a first dividing line at the bottom of the groove 20 according to embodiments of the present application. As shown in FIG. 4a, the first dividing line L1 is a straight line, and the first dividing line L1 is perpendicular to a first center line L2 passing through the center C of the wafer susceptor and a center O of the groove. An area of the first region S1 is equal to that of the second region S2. The first region S1 is close to the center C of the wafer susceptor, and the second region S2 is away from the center C of the wafer susceptor. In another embodiment, as shown in FIG. 4b, the first dividing line L1 is an arc with the center C of the wafer susceptor as a center and a distance between the center C of the wafer susceptor and the center O of the groove as a radius. The arc-shaped first dividing line L1 divides the groove bottom into two parts with unequal areas. The area of the first region S1 is unequal to that of the second region S2. The first region S1 is close to the center C of the wafer susceptor, and the second region S2 is away from the center C of the wafer susceptor.

As shown in FIG. 3, an edge of the convex structure 210 abuts against a side portion of the groove 20. A surface of the convex structure 210 is a curved surface. The curved surface is provided with a vertex H. As shown in the top view of FIG. 3, curves surrounding the vertex H in the groove 20 are considered as contour lines. It can be seen from location distribution of the contour lines shown in FIG. 3 that, an average height of the convex structure 210 in the second region S2 is greater than that of the convex structure 210 in the first region S1. A projection of the vertex H on a horizontal plane is located on the first center line L2 of the second region S2 of the groove bottom.

Figure 5:
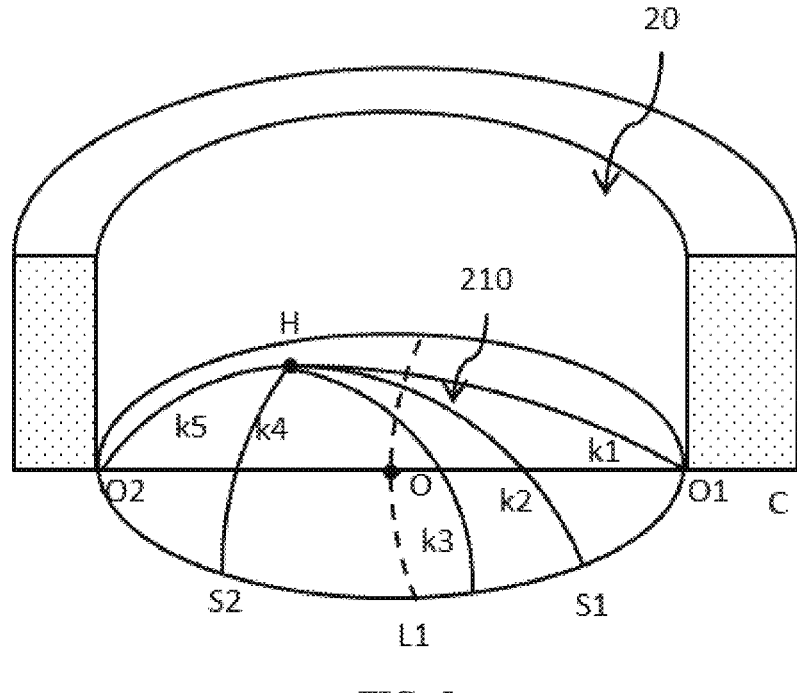
FIG. 5 is a schematic structural diagram of a single groove according to an embodiment of the present application.

FIG. 5 is a schematic structural diagram of a single groove 20 according to an embodiment. As shown in FIG. 5, a projection of the vertex H on a horizontal plane is located on a first center line L2 of the second region S2 of the groove bottom. The curved surface of the convex structure 210 is composed of innumerable curves staring from the vertex H to the edge of the convex structure 210, a curvature radius of each of the innumerable curves is a fixed value, and curvature radii of the innumerable curves gradually decrease from the first edge point to the second edge point along the edge of the convex structure 210. FIG. 5 shows curves k1 to k5. Curvature radii of the curves k1 to k5 are respectively r1, r2, r3, r4, and r5, and gradually decrease from the first edge point O1 close to the center C of the wafer susceptor to the second edge point O2 along the edge of the convex structure 210, that is, r5<r4<r3<r2<r1.

Figure 6:
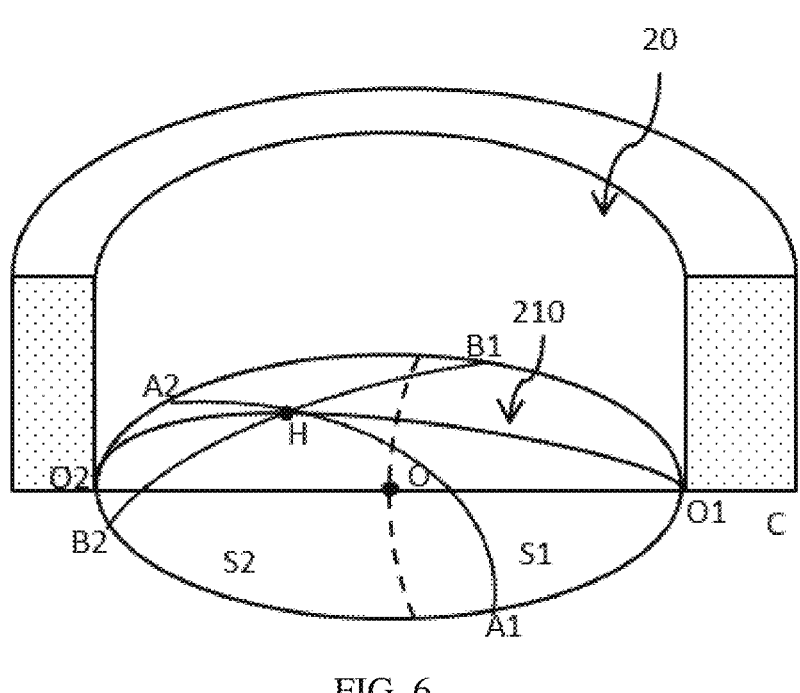
FIG. 6 is a schematic structural diagram of a single groove according to another embodiment of the present application.

FIG. 6 is a schematic structural diagram of a single groove 20 according to another embodiment of the present application. As mentioned in the foregoing embodiment, the surface of the convex structure 210 is composed of innumerable curves passing through the vertex H. In comparison, in this embodiment, the curved surface of the convex structure 210 may also be considered to be composed of innumerable curves passing through the vertex H and whose both ends are located on the edge of the convex structure 210. As an example, FIG. 6 shows curves O1O2, A1A2, and B1B2 passing through the vertex H. Projections of the innumerable curves passing through the vertex H are straight lines on a horizontal plane. One end of each curve close to the center C of the wafer susceptor is a first end, one end of each curve away from the center C of the wafer susceptor is a second end, and a curvature radius of each curve gradually decreases from the first end to the second end. Specifically, as shown in FIG. 6, points O1, A1, and B1 are respectively first ends of the curves O1O2, A1A2, and B1B2. Points O2, A2, and B2 are respectively second ends of the curves O1O2, A1A2, and B1B2. A curvature radius of each of the curves O1O2, A1A2, and B1B2 constantly changes from the first end to the second end, that is, the curvature radius gradually decreases from the first end to the second end.

Figure 7:
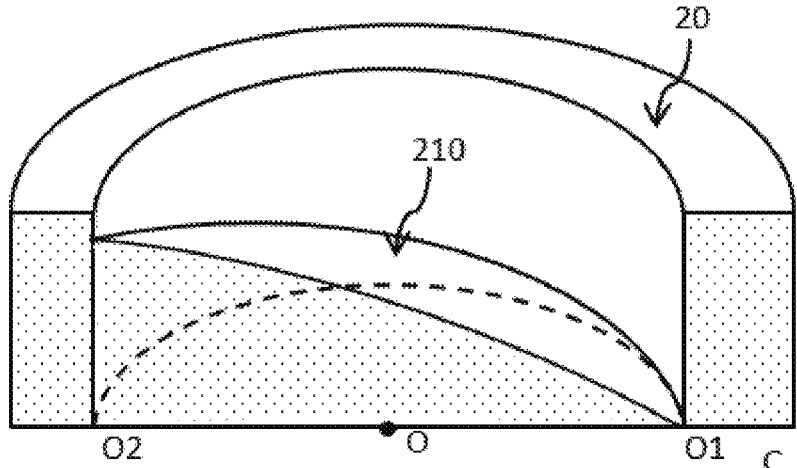
FIG. 7 is a schematic structural diagram of a single groove according to still another embodiment of the present application.

FIG. 7 is a schematic structural diagram of a section of the groove 20 according to still another embodiment of the present application. As shown in FIG. 7, a height of the edge of the convex structure 210 gradually increases from a first edge point O1 to a second edge point O2 along the edge of the convex structure 210.

Figure 8:
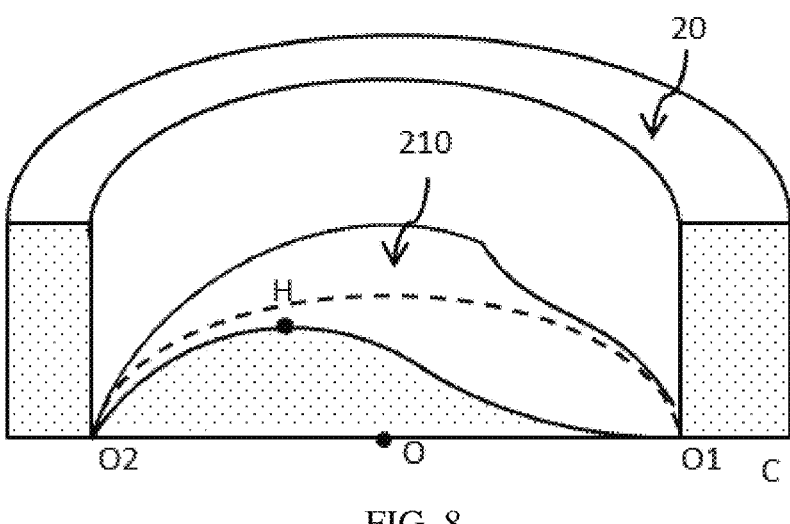
FIG. 8 is a schematic structural diagram of a single groove according to yet another embodiment of the present application.

FIG. 8 is a schematic structural diagram of a section of the groove 20 according to yet another embodiment of the present application. As shown in FIG. 8, on the curved surface of the convex structure 210, a tangent slope of a curve from a second edge point O2 to a vertex H is a positive value, and a tangent slope of a curve from the vertex H to a first edge point O1 changes from zero to a negative value, that is, a curve from the vertex H to the first edge point O1 has an inflection point, so that a tangent slope of the curve in front of the inflection point decreases, and a tangent slope of the curve behind the inflection point increases. A positive value of a tangent slope of a curve means that the curve is mountain-shaped, and a negative value of a curvature means that the curve is valley-shaped.

According to the foregoing embodiments of the present application, a location of the vertex H and a curvature radius of the curved surface of the convex structure 210 in different regions are adjusted, to adjust height distribution of the convex structure 210 at the groove bottom, so that a height of a part of the convex structure away from the center C of the wafer susceptor is properly increased, to constantly maintain a reasonable gap between the groove 20 of the wafer susceptor 10 and the wafer 30 subjected to a rotational centrifugal force of the wafer susceptor, thereby reducing an impact of the centrifugal force on growth of the wafer.

In view of the above, the groove bottom of the wafer susceptor in the present application is divided by the first dividing line passing through the center of the groove into the first region close to the center of the wafer susceptor and the second region away from the center of the wafer susceptor, the groove bottom includes the groove bottom surface and the convex structure formed on the groove bottom surface, the surface of the convex structure is a curved surface, and a vertex of the curved surface is located in the second region at the groove bottom. Therefore, an average height of the convex structure located in the second region is greater than that of the convex structure located in the first region. A design structure of the groove bottom of the wafer susceptor well matches a warped III-V group nitride wafer, to constantly maintain a reasonable gap between the wafer susceptor and the wafer subjected to a rotational centrifugal force of the wafer susceptor, which reduces an impact of the centrifugal force on growth of the wafer, guarantees stable temperature and air flow, enables a thermal field to be distributed more evenly, thereby improving quality of the epitaxial wafer and wavelength uniformity of the light-emitting epitaxial wafer, and increasing yield. Therefore, the wafer susceptor in this application has an extensive application prospect in fields of semiconductor manufacturing devices designing and manufacturing.

In this application, the wafer susceptor may be made of graphite. However, a material of the wafer susceptor is not particularly limited in this application. A person in the art know that, another material may be selected according to a design requirement. The foregoing descriptions are merely preferred embodiments of this application, but are not intended to limit this application. For a person skilled in the art, various changes and variations can be made in this application. Any modification, equivalent replacement, or improvement made without departing from the spirit and principle of this application shall fall within the protection scope of this application.

What is claimed is:

1. A wafer susceptor, comprising at least one groove, wherein the groove comprises:

a groove bottom, wherein the groove bottom is divided by a first dividing line passing through a center of the groove into a first region and a second region, the first region is closer to a center of the wafer susceptor than the second region, the groove bottom comprises a groove bottom surface and a convex structure formed on the groove bottom surface, a point, closest to the center of the wafer susceptor, on an edge of the convex structure is a first edge point, and a point, farthest away from the center of the wafer susceptor, on the edge of the convex structure is a second edge point, wherein an average height of the convex structure located in the second region is greater than that of the convex structure located in the first region, a surface of the convex structure is a curved surface, the curved surface is provided with a vertex, and a projection of the vertex on a horizontal plane is located in the second region of the groove bottom, wherein the groove further comprises a groove side portion, and the edge of the convex structure abuts against the groove side portion.

2. The wafer susceptor according to claim 1, wherein the first dividing line is a straight line, and the first dividing line is perpendicular to a first center line passing through the center of the wafer susceptor and the center of the groove.

3. The wafer susceptor according to claim 1, wherein the first dividing line is an arc with the center of the wafer susceptor as a center and a distance between the center of the wafer susceptor and the center of the groove as a radius.

4. The wafer susceptor according to claim 1, wherein the projection of the vertex on the horizontal plane is located on a first center line, and the first center line passes through the center of the wafer susceptor and the center of the groove.

5. The wafer susceptor according to claim 4, wherein the curved surface of the convex structure is composed of curves starting from the vertex to the edge of the convex structure, and a curvature radius of each of the curves is a fixed value.

6. The wafer susceptor according to claim 5, wherein curvature radii of the curves gradually decrease from the first edge point to the second edge point along the edge of the convex structure.

7. The wafer susceptor according to claim 4, wherein the curved surface of the convex structure is composed of curves passing through the vertex and whose both ends are located on the edge of the convex structure.

8. The wafer susceptor according to claim 7, wherein each of the curves comprises a first end and a second end, the first end is closer to the center of the wafer susceptor than the second end, and a curvature radius of each of the curves gradually decreases from the first end to the second end.

9. The wafer susceptor according to claim 4, wherein a height of the edge of the convex structure gradually increases from the first edge point to the second edge point along the edge of the convex structure.

10. The wafer susceptor according to claim 4, wherein on the curved surface of the convex structure, a tangent slope of a curve from the second edge point to the vertex is a positive value, and a tangent slope of a curve from the vertex to the first edge point changes from zero to a negative value.

\* \* \* \* \*